US008947070B2

(12) United States Patent
Jain et al.

(10) Patent No.: US 8,947,070 B2
(45) Date of Patent: *Feb. 3, 2015

(54) APPARATUS AND METHOD FOR TESTING DRIVER WRITEABILITY STRENGTH ON AN INTEGRATED CIRCUIT

(75) Inventors: Ashish R. Jain, Santa Clara, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 533 days.

This patent is subject to a terminal disclaimer.

(21) Appl. No.: 13/351,313

(22) Filed: Jan. 17, 2012

(65) Prior Publication Data

US 2012/0112736 A1   May 10, 2012

Related U.S. Application Data

(63) Continuation of application No. 12/481,265, filed on Jun. 9, 2009, now Pat. No. 8,125,211.

(51) Int. Cl.
*G11C 8/00* (2006.01)
*G01R 31/3185* (2006.01)
*G01R 31/319* (2006.01)

(52) U.S. Cl.
CPC .. *G01R 31/318572* (2013.01); *G01R 31/31924* (2013.01)
USPC .................. 324/76.11; 365/230.06; 365/201; 714/727; 714/30

(58) Field of Classification Search
CPC .................. G01R 31/31924; G01R 31/318572

USPC ...................................... 365/230.06; 714/727
See application file for complete search history.

(56) References Cited

U.S. PATENT DOCUMENTS

| 5,864,506 | A | 1/1999 | Arcoleo |
| 6,192,001 | B1 | 2/2001 | Weiss et al. |
| 6,487,687 | B1 | 11/2002 | Blake |
| 6,778,450 | B2 | 8/2004 | Selvin |
| 7,019,553 | B2 * | 3/2006 | Blodgett et al. ................. 326/30 |
| 7,068,078 | B2 | 6/2006 | Yoo |
| 7,199,615 | B2 * | 4/2007 | Stojanovic et al. ............. 326/82 |
| 8,001,305 | B2 * | 8/2011 | Horowitz et al. ............. 710/104 |
| 8,125,211 | B2 * | 2/2012 | Jain et al. .................... 324/76.11 |
| 2001/0053102 | A1 | 12/2001 | Salters |
| 2002/0064076 | A1 | 5/2002 | Huber |

* cited by examiner

*Primary Examiner* — Jeff Natalini
(74) *Attorney, Agent, or Firm* — Meyertons, Hood, Kivlin, Kowert & Goetzel, P.C.; Stephen J. Curran

(57) ABSTRACT

An apparatus and method for testing driver write-ability strength on an integrated circuit includes one or more drive detection units each including a number of drivers. At least some of the drivers may have a different drive strength and each may drive a voltage onto a respective driver output line. Each drive detection unit may include a number of keeper circuits, each coupled to a separate output line and configured to retain a given voltage on the output line to which it is coupled. Each detection unit may also include a number of detection circuits coupled to detect the drive voltage on each of the output lines. In one implementation, the drive voltage appearing at the output line of each driver may be indicative of that the driver was able to overdrive the voltage being retained on the output line to which it is coupled by the respective keeper circuits.

20 Claims, 4 Drawing Sheets

APPARATUS AND METHOD FOR TESTING DRIVER WRITEABILITY STRENGTH ON AN INTEGRATED CIRCUIT

PRIORITY INFORMATION

This application is a continuation application of U.S. patent application Ser. No. 12/481,265, entitled "Apparatus and Method for Testing Driver Writeability Strength on an Integrated Circuit", which was filed Jun. 9, 2009 now U.S. Pat. No. 8,125,211.

BACKGROUND OF THE INVENTION

1. Field of the Invention

This invention relates to integrated circuits and, more particularly, to drive strength test circuits.

2. Description of the Related Art

The manufacturing of integrated circuits is a complex process. Bringing a new circuit design to a fabrication facility, or bringing an existing circuit design to a new fabrication facility may require a number of characterization steps to establish a device library. Depending on the process technology, and the complexity of the circuits, there may be several iterations of process adjustments to ensure reliable operation of the manufactured devices. In many cases, there may be several revisions of silicon before the design is fully operational. Accordingly, it may be desirable to reduce the number of iterations of process adjustments, particularly during device and process characterization.

SUMMARY

Various embodiments of an apparatus and method for testing driver write-ability strength on an integrated circuit are disclosed. In one embodiment, an integrated circuit may include one or more drive detection units. Each of the drive detection units may include a number of drivers. At least some of the drivers may have a different drive strength and each may be configured to drive an associated drive voltage level such as a voltage corresponding to a ground potential, for example, onto a respective driver output line. In addition, each drive detection unit may include a number of keeper circuits. Each keeper circuit may be coupled to a separate output line and configured to retain a different voltage such a voltage near a supply voltage, for example, on the output line to which it is coupled. Each detection unit may also include a number of detection circuits coupled to detect the voltage level on each of the output lines. In one implementation, the drive voltage appearing at the output line of each driver may indicative that the driver was able to overdrive the voltage being retained on the output line to which it is coupled by the respective keeper circuits.

In another embodiment, a method comprises executing a drive strength test using a drive detection unit including a number of drive modules on an integrated circuit. Executing the drive strength test may include a first transistor of each drive module retaining a given voltage level on a respective output line of each drive module. The first transistor may be associated with a first drive strength. The method may also include a second transistor of each drive module driving a second voltage level onto each respective output line. Each second transistor may be associated with a different drive strength than each other transistor. The method may also include detecting whether the drive voltage is being driven on each respective output line and outputting a digital value from each drive module that that corresponds to the associated drive voltage in response to detecting that the associated drive voltage is being driven on the respective corresponding output line. Accordingly, each digital value may indicate whether the associated drive module drive strength is sufficient to overdrive the given voltage level that was retained on each output line.

Figure 1:
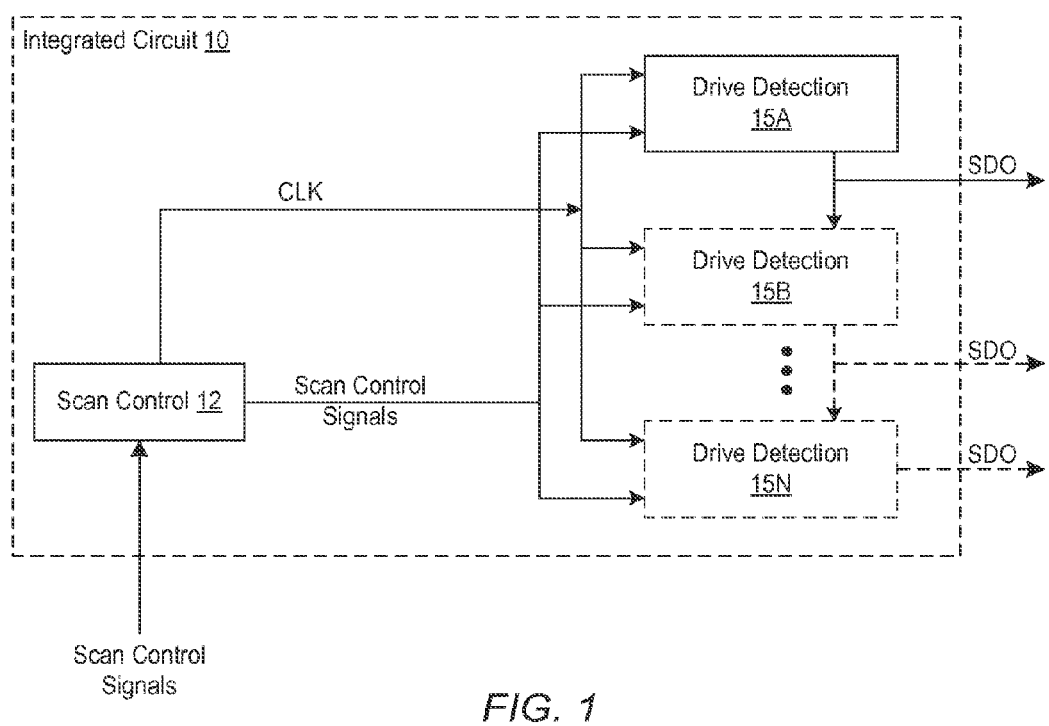
FIG. 1 is a block diagram of one embodiment of an integrated circuit including drive detection units.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of an integrated circuit is shown. The integrated circuit 10 includes drive detection units 15A, 15B and 15N. In addition, the integrated circuit 10 includes a scan control unit 12 that is coupled to provide scan control signals and a clock (CLK) signal to the drive detection units 15A through 15N. As denoted by the dashed lines, in various embodiments, there may be a single drive detection unit or there may be multiple drive detection units. Accordingly, in such multiple unit embodiments, N may be any whole number. It is noted that components having a reference designator including a number and a letter may be referred to by the number alone where appropriate.

The scan control unit 12 is coupled to receive various scan control signals from a source external to the integrated circuit (e.g. another component of the system that includes the integrated circuit 10, not shown in FIG. 1, or from a test system that may be connected directly or indirectly to the integrated circuit 10). As will be described in greater detail below, the drive detection units 15 may be coupled into a scan chain (e.g. from drive detection unit 15A to drive detection unit 15B to drive detection unit 15N to the scan data out (SDO) output of the integrated circuit 10, in the illustrated embodiment) to permit results to be scanned out of the drive detection units 15A-15N for observation external to the integrated circuit 10. Alternatively, one or more of the drive detection units 15 may be included in separate scan chains (e.g. with core logic circuitry, not shown in FIG. 1). There may also be a scan data input at the head of the scan chain, which may not be used by the drive detection units 15 (the scan in data may be a don't care), but could be used by core circuitry included in the scan chain.

In one embodiment, drive detection units 15 may include circuitry configured to determine a drive strength of a drive transistor that may reliably write a data value on an output line in the presence of contention on the output line of the drive transistor. More particularly, drive detection units 15 may include a number of drive transistors each having a different drive strength. Each of the drive transistors may be coupled to an output line. In addition, to force contention on the output line, each output line may also be coupled to a keeper circuit that may include another transistor that is coupled to retain a particular voltage level on the output line, where the particular voltage level is opposite the voltage level that the driver is trying to provide. The drive transistors may be configured to have a range of drive strengths relative to a predetermined drive strength of a transistor such as a reference transistor with a predetermined gate width. This configuration is shown in FIG. 2 and described more fully below.

Figure 2:
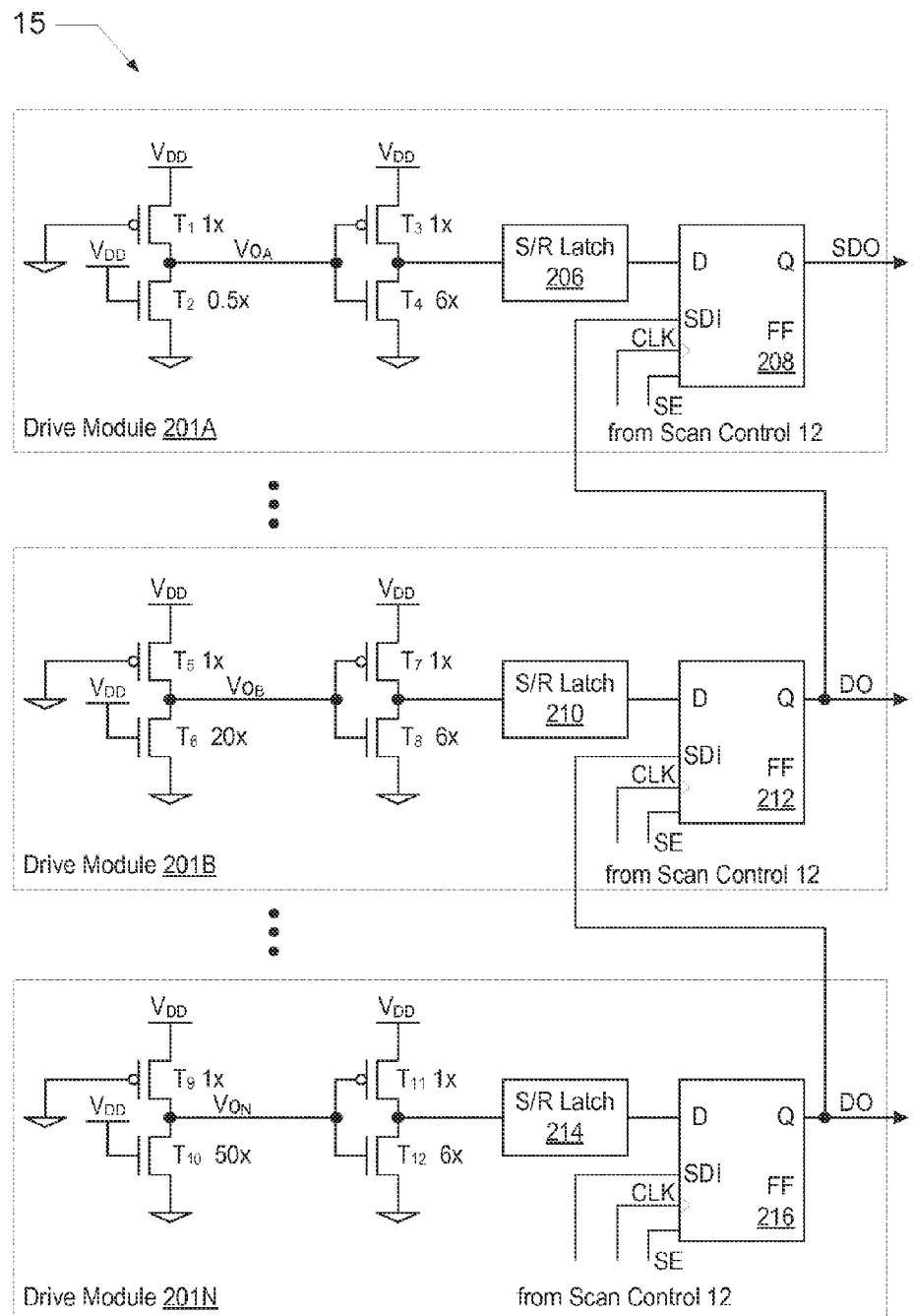
FIG. 2 is a diagram of one embodiment of a drive detection unit shown in FIG. 1.

Referring to FIG. 2, a diagram of one embodiment of a drive detection unit 15 is shown. The drive detection unit 15 includes a number of drive modules designated 201A through 201N, where N may be any whole number. As shown, each of the drive modules 201 includes a driver (e.g., transistors T2, T6, and T10) whose output is coupled to an output of a keeper circuit (e.g., transistors T1, T5, and T9). In addition, each drive module 201 includes an inverter circuit (e.g., transistors T3 and T4; T7 and T8; and T11 and T12) which is coupled to the output of the driver and keeper circuit. The output of each inverter is coupled to an S/R latch (e.g., 206, 210, and 214). The output of each S/R latch is coupled to a flip-flop (e.g., 208, 212, and 216). In the illustrated embodiment, the flip-flops are coupled together serially such that the output of one flip-flop (e.g., FF216) is coupled to the scan data in (SDI) input of a next flip-flop (e.g., FF212). The last flip-flop output is labeled scan data out (SDO). In addition, each flip-flop is coupled to receive scan control signals (e.g., CLK and scan enable (SE)) from scan control unit 12 of FIG. 1.

In the illustrated embodiment, the driver transistors (e.g., transistors T2, T6, and T10) are sized differently in each driver module 201. In one embodiment, there may be 12 drive modules 201 and the driver sizes (i.e. drive strengths) may be in the range 0.5 through 51. The intermediate driver sizes may be selected according to designer choice based upon such factors as the desired granularity with which a reliable drive strength may be determined, the technology of the fabrication facility, the process being used to manufacture the circuits, and so on. For example, in one embodiment, the driver sizes may be equally or nearly equally distributed from 0.5 to 51 in 12 drivers. In another embodiment, the driver sizes may be clustered in smaller increments near a calculated switch point. In one embodiment, the drive strength values are multiplier values referenced against a predetermined transistor drive strength standard for the library of the fabrication facility being used. For example, a transistor having a drive strength of 1× may have the same drive strength as a particular reference transistor in the library that has a particular gate width (i.e., channel length). Thus, a transistor having a drive strength of 2× may have drive strength that is twice as large as the particular reference transistor in the library, and so on for 0.5×, 3×, 50×, etc. It is noted that in other embodiments, other drive strengths and ranges may be used.

It is noted that the operation of each driver module 201 may be similar. Accordingly, only the operation of driver module 201A will be described in detail in the following driver module operational description. During operation, since the gate of p-type transistor T1 is coupled to circuit ground, transistor T1 is conducting. Thus, transistor T1 is trying to force the output line $Vo_A$ to be held to the supply voltage level (e.g., VDD). Similarly, since the gate of n-type transistor T2 is coupled to VDD, transistor T2 is conducting and trying to force the output line $Vo_A$ to be at circuit ground potential. Clearly there is contention on the output line $Vo_A$. As such, the transistor with a larger drive strength will overdrive the weaker transistor, and a corresponding voltage level will appear at the output line. The inverter circuit (e.g., T3 and T4) will invert the voltage appearing at the output line $Vo_A$.

The input voltage level that is necessary to cause the output of the inverter to be at a logic level of one or a logic level of zero depends on the drive strength of transistors T3 and T4. As shown, transistor T4 has been implemented to have a 6× drive strength while transistor T3 has a 1× drive strength. Thus, the inverter preferentially outputs a logic level of zero with a higher voltage level, which means the driver T2 must sufficiently overdrive the keeper transistor T1 to force a low enough voltage level at $Vo_A$ to cause transistor T3 to turn on and transistor T4 to turn off. This preferential switching level acts as a guard band for the driver circuit.

In one embodiment, the output of the inverter is latched in the S/R latch 206, and the output of S/R latch 206 is captured in FF 208 on the next edge and every subsequent edge of CLK. Accordingly, after some predetermined setup time FF208 may be clocked one or more times to capture the drive state of driver module 201A.

Depending on the captured value of each of FF208, FF212, and FF216, it may be determined whether the selected drive strength of each driver (e.g., T2, T6, and T10) was sufficient to overdrive the respective keeper transistors (e.g., T1, T5, and T9). In this example, if the captured driver state is a logic value of one, then the driver was able to overdrive the keeper circuit. Conversely, if the captured driver state is a logic value of zero, then the driver was not able to overdrive the keeper.

Accordingly, in one embodiment, after the clocking FF208, FF212, and FF216, scan control unit 12 may assert the SE to place the driver modules and thus each drive detection unit 15 into scan mode to scan the captured driver state out of each drive detection unit 15. In the illustrated embodiment, the outputs of FF208, FF212, and FF216 may be serially clocked out to the SDO output of FF208 by clocking FF208, FF212, and FF216 with a number of clock pulses equal to the number of flip-flops to be scanned, with the SE signal asserted. The resultant scan vector includes a number of bits. Each bit indicates a particular driver state and whether that driver was able to overdrive the keeper circuit. Thus for each drive detection unit, the drive strength threshold (i.e., the drive strength necessary to overdrive the keeper circuit) may be determined. This may be useful in determining driver strengths in circuits that may be required to begin driving a line or node when there is some contention. For example, in circuits in which a write driver begins writing a value before a previous write is complete.

It is noted that in the embodiment illustrated in FIG. 2, the keeper circuit is shown as a p-type transistor and the driver is an n-type transistor. However, it is contemplated that in other embodiments, the keeper circuit may be the n-type transistor and the p-type transistor may be the driver. In such embodiments, the n-type transistor drive strength may be fixed, and the drive strength of the p-type transistor may be different in each drive module 201. Thus, the keeper circuit is attempting to retain a ground potential on the output line at $Vo_A$, while the drive circuit is attempting to overdrive the keeper circuit by pulling up the output line to VDD. In addition, the drive strengths of the transistors in the inverter circuit would be changed such that the p-type transistors would have a larger drive strength than the n-type transistors. This causes (biases) the inverter to preferentially output a logic level of one with a lower voltage level, which means the driver must sufficiently overdrive the keeper transistor to force a high enough voltage level at $Vo_A$ to cause the n-type transistor to turn on and the p-type transistor to turn off.

Figure 3:
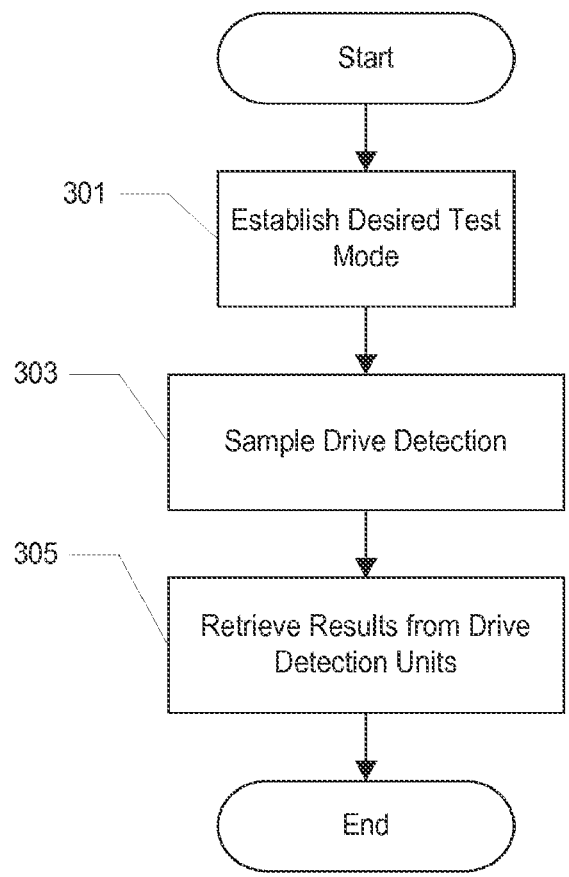
FIG. 3 is a flow diagram describing operational aspects of the embodiments of the drive detection units depicted in FIG. 1 and FIG. 2.

In FIG. 3, a flow diagram that depicts the operation of one embodiment of integrated circuit 10 is shown. While the blocks are shown in a particular order for ease of understanding, other orders may be used. Referring collectively to FIG. 1 through FIG. 3 and beginning in block 301 of FIG. 3, the desired test mode may be established in some embodiments. For example, in one embodiment, power may be applied, while in other embodiments, a specific test mode may be invoked. After a predetermined amount of time has elapsed, the flip-flops shown in FIG. 2 may be clocked one or more times to capture or sample the output level corresponding to the driver output (block 303). In one embodiment, the scan control unit 12 may clock the flip-flops. Alternatively, other clock circuitry (not shown) may clock the flip-flops. Once the flip-flops have captured the output levels, the results may be retrieved (block 305). In one embodiment, the scan control unit 12 may gate the CLK signal, assert the SE signal to the flip-flops and then provide a number of clock pulses sufficient to clock the flip-flop values serially through one or more scan chains that include each flip-flop, and out the SDO pin of the IC 10 as described above. Based upon the digital values scanned out, a determination may be made as to where the drive strength threshold may be for a given drive unit.

In various embodiments, the scan data may be output to a device tester, or other system or device used for testing integrated circuits. Alternatively, the results may stored into a memory for future retrieval and analysis.

It is noted that in one embodiment, integrated circuit 10 may be implemented as a test chip on a wafer, in which case integrated circuit 10 may not have any other functionality. In other embodiments, drive detection units 15 may be implemented within the scribe lines of a wafer. In still other embodiments, integrated circuit 10 may include other functionality. For example, integrated circuit 10 may be a processor chip, a communication chip, a controller, or the like. In such embodiments, the drive detection units 15 may be implemented as just one part of the integrated circuit chip. One such embodiment is shown in FIG. 4.

Figure 4:
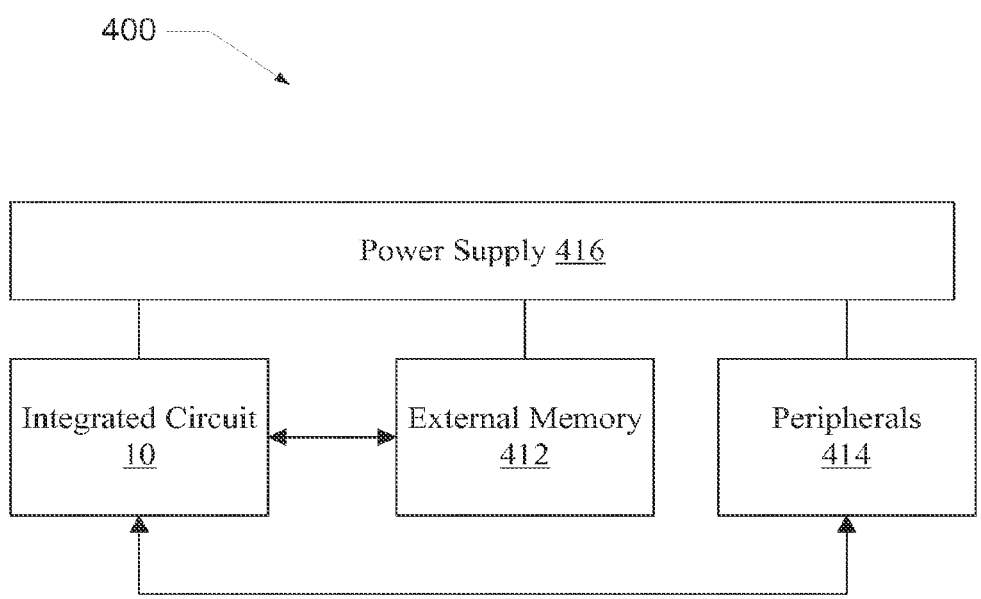
FIG. 4 is a block diagram of one embodiment of a system including the integrated circuit shown in FIG. 1

Turning to FIG. 4, a block diagram of one embodiment of a system 400 including integrated circuit 10 is shown. The system 400 includes at least one instance of the integrated circuit 10 of FIG. 1 coupled to one or more peripherals 414 and an external memory 412. The system 400 also includes a power supply 416 that may provide one or more supply voltages to the integrated circuit 10 as well as one or more supply voltages to the memory 412 and/or the peripherals 414. In some embodiments, more than one instance of the integrated circuit 10 may be included.

The external memory 412 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 414 may include any desired circuitry, depending on the type of system 110. For example, in one embodiment, the system 400 may be a mobile device and the peripherals 414 may include devices for various types of wireless communication, such as WiFi, Bluetooth, cellular, global position system, etc. The peripherals 414 may also include additional storage, including RAM storage, solid-state storage, or disk storage. The peripherals 414 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
    one or more drive detection units, wherein each drive detection unit includes:
        a first write driver having a first drive strength and configured to drive a first drive voltage on a first output line;
        a second write driver having a second drive strength and configured to drive a second drive voltage on a second output line;
        a first keeper circuit associated with the first write driver and configured to retain a given voltage level at the first output line of the first write driver;
        a second keeper circuit associated with the second write driver and configured to retain another given voltage level at the second output line of the second write driver;
        a first detection circuit associated with the first write driver and configured to detect whether the first drive voltage is being driven on the first output line; and
        a second detection circuit associated with the second write driver and configured to detect whether the second drive voltage is being driven on the second output line.

2. The integrated circuit as recited in claim 1, wherein the first detection circuit detecting the first drive voltage at the first output line indicates that the first write driver drive strength is sufficient to overdrive the first keeper circuit, and the second detection circuit detecting the second drive voltage at the second output line indicates that the second write driver drive strength is sufficient to overdrive the second keeper circuit.

3. The integrated circuit as recited in claim 1, wherein each of the first and the second write drivers comprises a respective n-type metal oxide semiconductor transistor coupled to drive the first and the second output line, respectively, to a voltage corresponding to a circuit ground potential, wherein a gate terminal of each of the n-type metal oxide semiconductor transistors is coupled to a supply voltage.

4. The integrated circuit as recited in claim 1, wherein each of the first and the second keeper circuits comprises a respective p-type metal oxide semiconductor transistor coupled to retain a voltage corresponding to a supply voltage at the first and the second output lines, respectively, wherein a gate terminal of each of the p-type metal oxide semiconductor transistors is coupled to a circuit ground potential.

5. The integrated circuit as recited in claim 1, wherein the first detection circuit comprises a first inverter circuit comprising a first p-type metal oxide semiconductor transistor having a third drive strength and a first n-type metal oxide semiconductor transistor having a fourth drive strength, wherein the fourth drive strength is larger than the third drive strength, wherein an input of the first inverter circuit is coupled to the first output line.

6. The integrated circuit as recited in claim 5, wherein the second detection circuit comprises a second inverter circuit comprising a second p-type metal oxide semiconductor transistor having a fifth drive strength and a second n-type metal oxide semiconductor transistor having a sixth drive strength, wherein the sixth drive strength is larger than the fifth drive strength, wherein an input of the second inverter circuit is coupled to the second output line.

7. The integrated circuit as recited in claim 5, wherein the first detection circuit further comprises a first set/reset latch circuit configured capture an output voltage level of the first inverter, and the second detection circuit further comprises a second set/reset latch circuit configured capture an output voltage level of the second inverter.

8. The integrated circuit as recited in claim 7, wherein the first detection circuit further comprises a first flip-flop configured to capture the output voltage level of the first set/reset latch circuit, and the second detection circuit further comprises a second flip-flop configured to capture the output voltage level of the second set/reset latch circuit.

9. The integrated circuit as recited in claim 8, further comprising a scan control unit coupled to each of the one or more drive detection units and configured to generate scan control signals to cause the output voltage level captured within each flip-flop to be output serially, using one or more scan chains, to one or more serial data outputs of the integrated circuit.

10. The integrated circuit as recited in claim 1, wherein each of the first and the second write drivers comprises a respective p-type metal oxide semiconductor transistor coupled to drive the first and the second output line, respectively, to a voltage corresponding to a supply voltage potential, wherein a gate terminal of each of the p-type metal oxide semiconductor transistors is coupled to the circuit ground potential.

11. The integrated circuit as recited in claim 1, wherein each of the first and the second keeper circuits comprises a respective n-type metal oxide semiconductor transistor coupled to retain a voltage corresponding to a circuit ground potential at the respective corresponding output line, wherein a gate terminal of each of the each of the n-type metal oxide semiconductor transistors is coupled to a supply voltage.

12. A drive detection unit comprising:
a plurality of drive modules, wherein at least some of the drive modules have a different drive strength, and wherein each drive module includes:
a driver configured to drive an associated drive voltage onto a respective corresponding output line;
a keeper configured to maintain a different voltage on the respective corresponding output line;
a detection circuit coupled to the respective corresponding output line, and configured to output a first digital value in response to detecting the associated drive voltage is being driven on the respective corresponding output line.

13. The drive detection unit as recited in claim 12, wherein the detection circuit is further configured to output a second digital value in response to detecting a voltage other than the associated drive voltage is being driven on the respective corresponding output line.

14. The drive detection unit as recited in claim 12, wherein detecting the associated drive voltage at the respective corresponding output line indicates that the associated drive module drive strength is sufficient to overdrive the given voltage level.

15. The drive detection unit as recited in claim 12, wherein the driver comprises an n-type metal oxide semiconductor transistor coupled to drive the respective corresponding output line to the associated drive voltage, wherein a gate terminal of the n-type metal oxide semiconductor transistor is coupled to a supply voltage, and wherein the associated drive voltage comprises a voltage corresponding to a circuit ground potential.

16. The drive detection unit as recited in claim 12, wherein the keeper comprises a p-type metal oxide semiconductor transistor coupled to maintain the different voltage on the respective corresponding output line, wherein a gate terminal of the p-type metal oxide semiconductor transistor is coupled to a circuit ground potential, and wherein the different voltage comprises a supply voltage.

17. The drive detection unit as recited in claim 12, wherein each detection circuit is further configured to output a second digital value appearing at a scan input in response to a transition of a clock signal and an assertion of a scan enable signal.

18. A method comprising:
executing a drive strength test using a drive detection unit including a plurality of drive modules within an integrated circuit, wherein executing the drive strength test comprises:
a first transistor of each drive module retaining a given voltage level on a respective corresponding output line of each drive module, wherein the first transistor is associated with a first drive strength;
a second transistor of each drive module driving an associated drive voltage onto the respective corresponding output line, wherein at least some of the second transistors have a different drive strength;
outputting from each drive module a first digital value that corresponds to the associated drive voltage in response to a detection of the associated drive voltage being driven on the respective corresponding output line.

19. The method as recited in claim 18, wherein the digital value indicates the associated drive module drive strength is sufficient to overdrive the given voltage level.

20. The method as recited in claim 18, further comprising outputting from each drive module a second digital value in response to detecting that a voltage other than the associated drive voltage is being driven on the respective corresponding output line.

* * * * *